(12) United States Patent
Yin et al.

(10) Patent No.: US 8,616,662 B2
(45) Date of Patent: Dec. 31, 2013

(54) ELECTRONIC DEVICE ENCLOSURE

(75) Inventors: Xiu-Zhong Yin, Shenzhen (CN); Xiu-Quan Hu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 79 days.

(21) Appl. No.: 13/479,473

(22) Filed: May 24, 2012

(65) Prior Publication Data

US 2013/0093302 A1 Apr. 18, 2013

(30) Foreign Application Priority Data

Oct. 14, 2011 (CN) .......................... 2011 1 0311650

(51) Int. Cl.
*A47B 81/00* (2006.01)

(52) U.S. Cl.
USPC .................................. 312/223.2; 361/679.33

(58) Field of Classification Search
USPC ...................... 312/223.2; 361/679.33–679.39
See application file for complete search history.

(56) References Cited

U.S. PATENT DOCUMENTS

| 7,265,996 B2 * | 9/2007 | Fan et al. ........................ 361/801 |
| 7,301,778 B1 * | 11/2007 | Fang ............................... 361/759 |
| 7,440,271 B2 * | 10/2008 | Chen et al. ............... 361/679.33 |
| 8,054,621 B2 * | 11/2011 | Chang ..................... 361/679.37 |
| 8,379,380 B2 * | 2/2013 | Zhang ...................... 361/679.33 |
| 8,434,833 B2 * | 5/2013 | Hsu et al. .................... 312/223.2 |
| 8,534,777 B2 * | 9/2013 | Gong et al. ................ 312/223.2 |
| 2006/0061956 A1 * | 3/2006 | Chen et al. ..................... 361/685 |
| 2007/0145866 A1 * | 6/2007 | Huang et al. ................... 312/215 |
| 2007/0217144 A1 * | 9/2007 | Peng et al. ..................... 361/685 |
| 2012/0242203 A1 * | 9/2012 | Gong et al. ................ 312/223.2 |

* cited by examiner

*Primary Examiner* — Daniel Rohrhoff
(74) *Attorney, Agent, or Firm* — Altis Law Group, Inc.

(57) ABSTRACT

An electronic device enclosure includes a chassis, a bracket received in the chassis, and a mounting assembly. The chassis includes a limiting protrusion and defines a sliding slot. The mounting assembly includes a resisting member, a rotating member and an operating member. The resisting member is secured to the bracket and includes an elastic deformable resisting portion. The rotating member is rotatably attached to the bracket and includes a first blocking portion and a blocking piece. The operating member is rotatably attached to the bracket and includes an installation portion and a second blocking portion. The installation portion is received between the blocking piece and the first blocking portion. The blocking piece is located between the resisting portion and the installation portion. The first and second blocking portions are received in the sliding slot. The limiting protrusion is blocked between the first and second blocking portions.

20 Claims, 6 Drawing Sheets

ELECTRONIC DEVICE ENCLOSURE

BACKGROUND

1. Technical Field

The present disclosure relates to electronic device enclosures, and particularly to an electronic device enclosure of a server or a computer.

2. Description of Related Art

In electronic systems, a plurality of servers are slid into a chassis of the electronic system, and then secured to the chassis by a plurality of screws, which is laborious and time consuming.

Therefore, there is room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
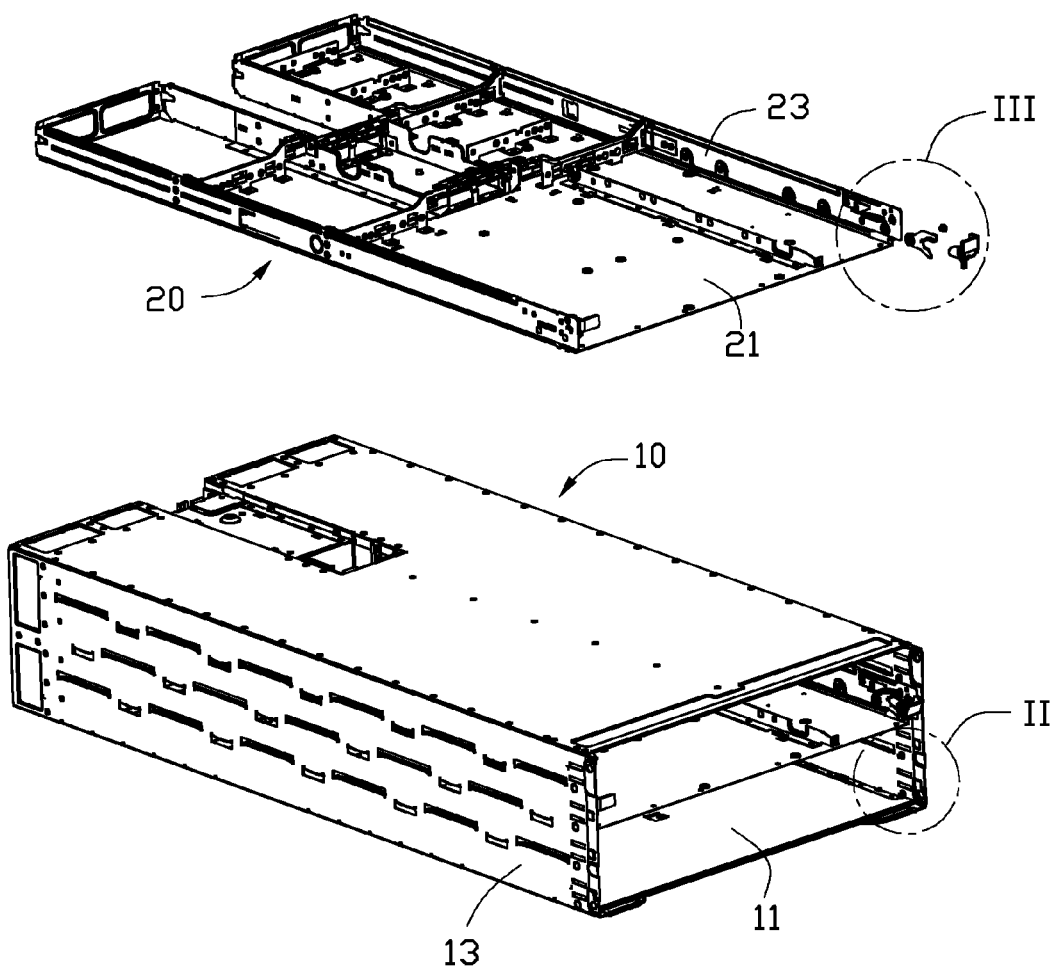
FIG. 1 is an exploded, isometric view of an embodiment of an electronic device enclosure.
Figure 2:
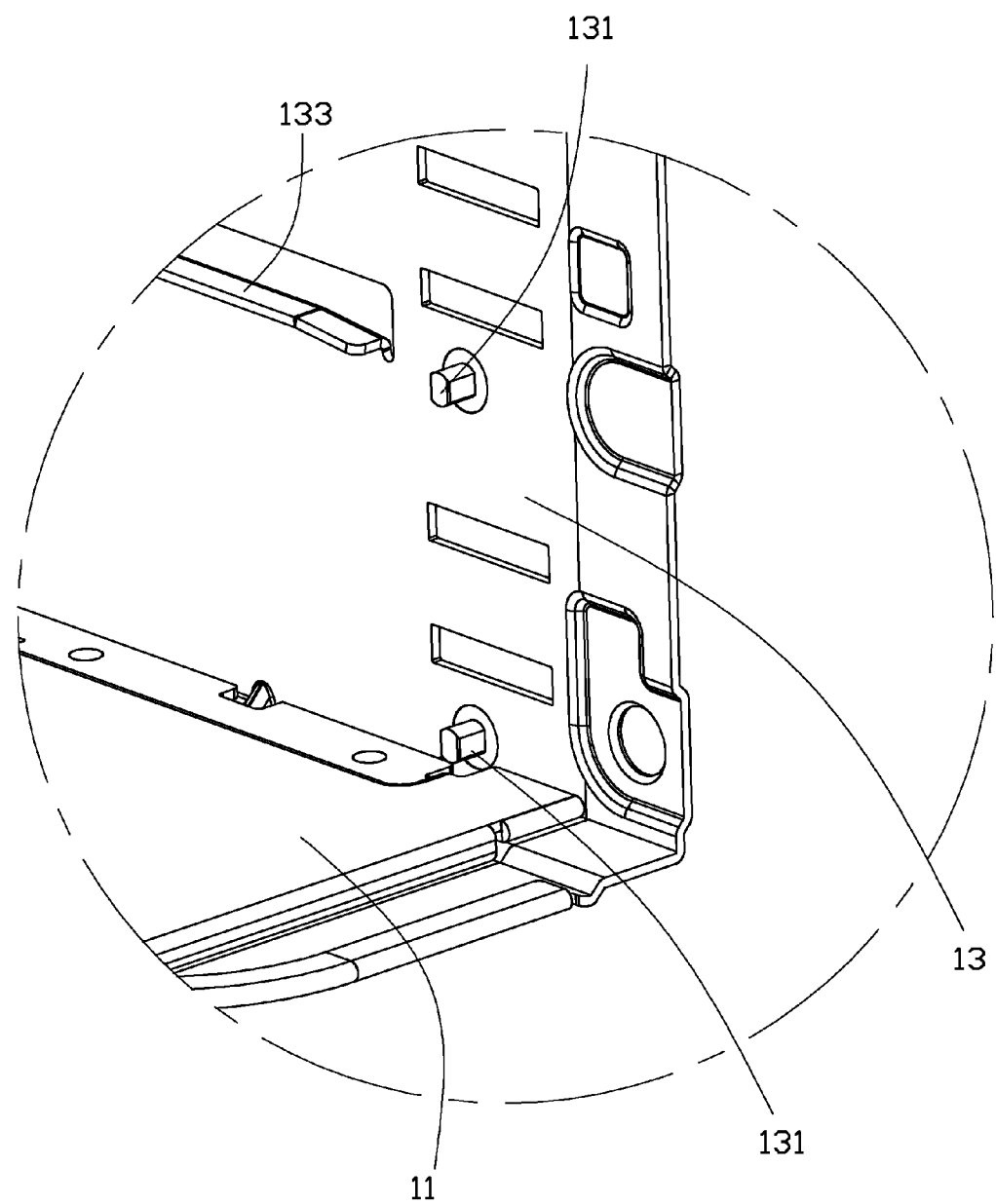
FIG. 2 is an enlarged view of a circled portion II of FIG. 1.
Figure 3:
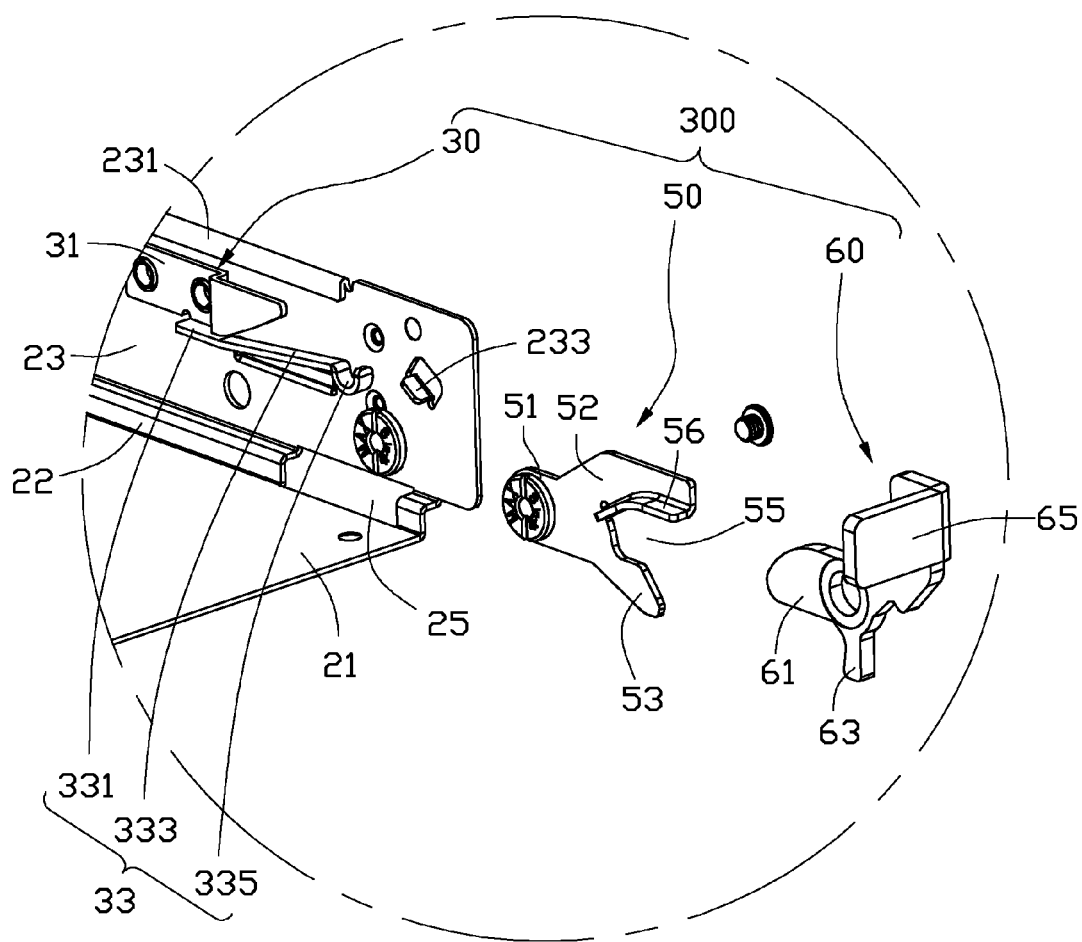
FIG. 3 is an enlarged view of a circled portion III of FIG. 1.

FIGS. 1-3 show an electronic device enclosure in accordance with an embodiment including a chassis 10, a plurality of brackets 20, and a mounting assembly 300.

The chassis 10 includes a bottom plate 11, two side plates 13 connected to the bottom plate 11, and a plurality of limiting plates 133 and a plurality of limiting protrusions 131 protruding from each of the two side plates 13. In FIG. 2, only one limiting plate 133 and two limiting protrusions 131 are shown. In one embodiment, the bottom plate 11 is substantially perpendicular to the two side plates 13, and each limiting plate 133 is substantially perpendicular to the side plate 13. In other embodiments, the plurality of limiting plates 133 and the plurality of the limiting protrusions 131 only protrude from one of the two side plates 13.

Each bracket 20 includes a bottom wall 21, two sidewalls 23 substantially perpendicular to the bottom wall 21, a connecting portion 22 located on a corner between the bottom wall 21 and the sidewall 23 connecting the bottom wall 21 to the sidewall 23, a flange 231, and a limiting piece 233. The connecting portion 22 defines a sliding slot 25. The flange 231 bends from a top edge of the sidewall 23. In one embodiment, the flange 231 is substantially parallel to the sidewall 23. The limiting piece 233 extends from the sidewall 23 and is oblique relative to the bottom wall 21 and substantially perpendicular to the sidewall 23. An acute angle is defined between the limiting piece 233 and the bottom wall 21. In one embodiment, the connecting portion 22 and the sliding slot 25 both have an "L" shape. The bracket 20 is adapted for receiving a server.

The mounting assembly 300 includes a resisting member 30, a rotating member 50, and an operating member 60.

The resisting member 30 includes a mounting portion 31 and a resisting portion 33. The resisting member 33 extends from a bottom edge of the mounting portion 3l and includes a connecting piece 331, a resilient arm 333, and a protruding portion 335. The protruding portion 335 extends from a first end of the resilient arm 333. The connecting piece 331 connects the bottom edge of the mounting portion 31 and is located on a second end of the resilient arm 333. The first end is opposite to the second end. In one embodiment, the protruding portion 335 is arched.

The rotating member 50 includes a pivoting portion 51, a first blocking portion 53, and an assisting portion 52. The first blocking portion 53 and the assisting portion 52 extend from the pivoting portion 51. A receiving opening 55 is defined between the first blocking portion 53 and the assisting portion 52. A blocking piece 56 extends from an edge of the assisting portion 52, which faces the first blocking portion 53. In one embodiment, the blocking piece 56 is curved.

The operating member 60 includes an installation portion 61, a second blocking portion 63, and an operating portion 65. The operating portion 65 is substantially perpendicular to the installation portion 61. The second blocking portion 63 extends downwards from the installation portion 61.

Figure 4:
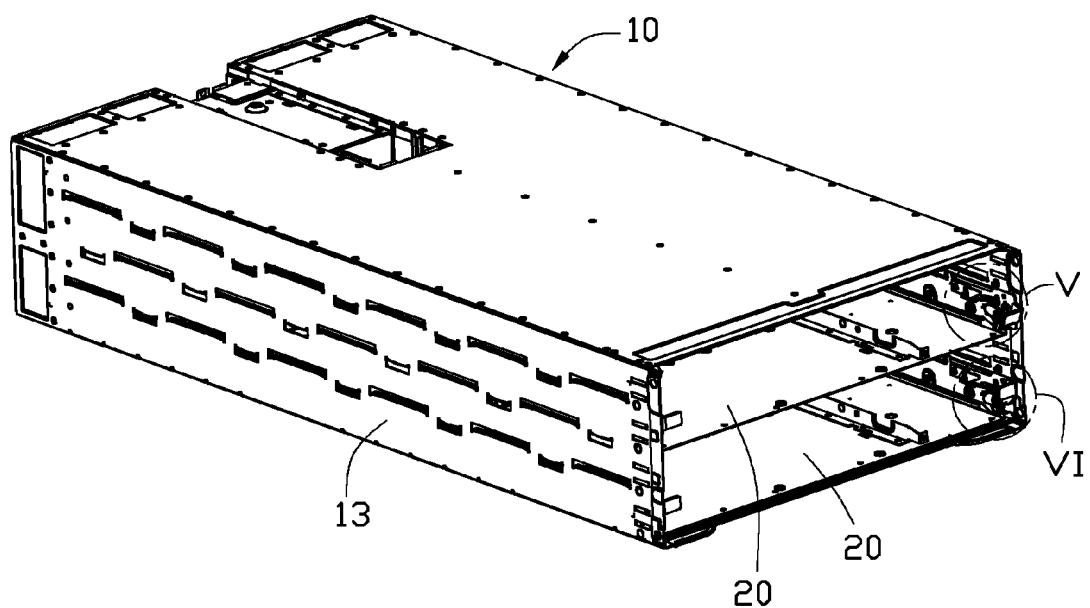
FIG. 4 is an assembled, isometric view of the electronic device enclosure of FIG. 1.
Figure 5:
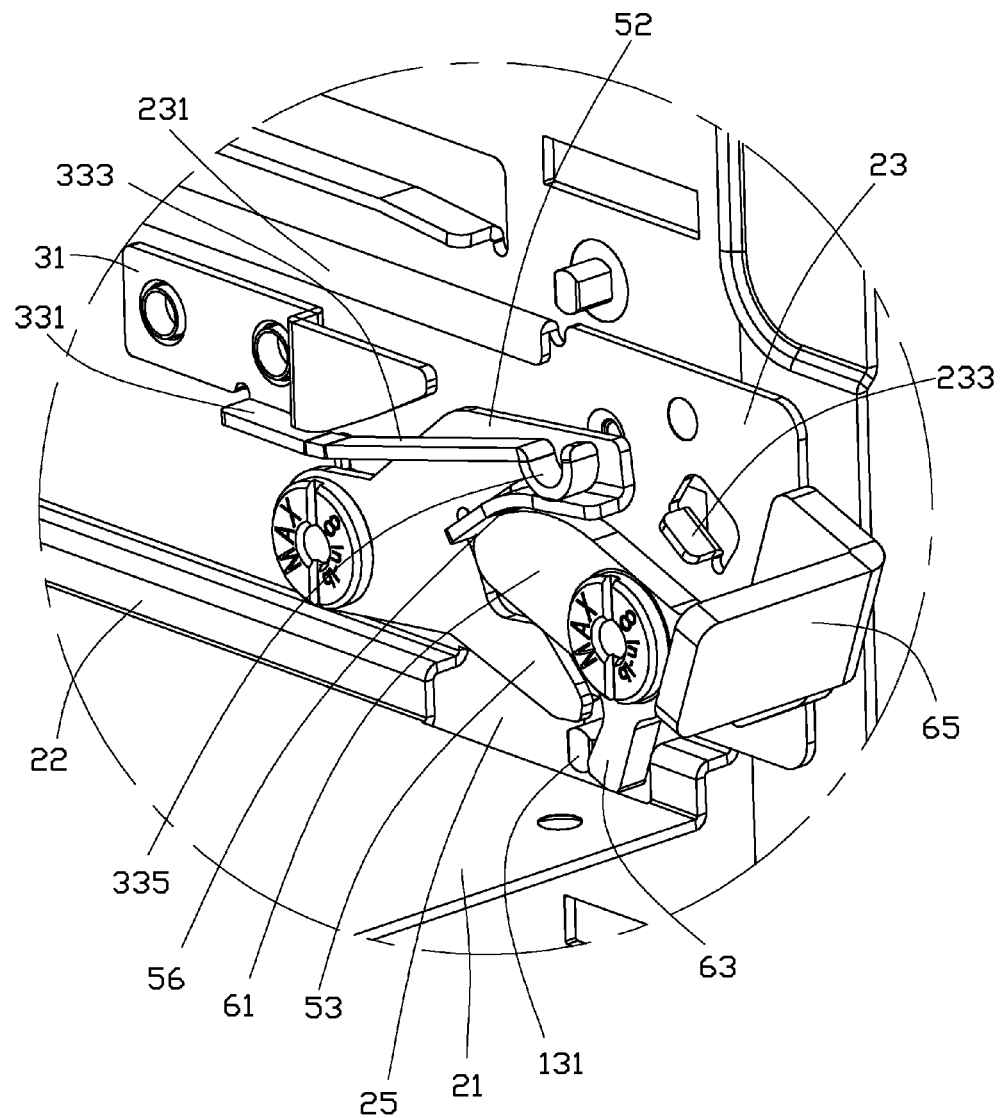
FIG. 5 is an enlarged view of a circled portion V of FIG. 4.
Figure 6:
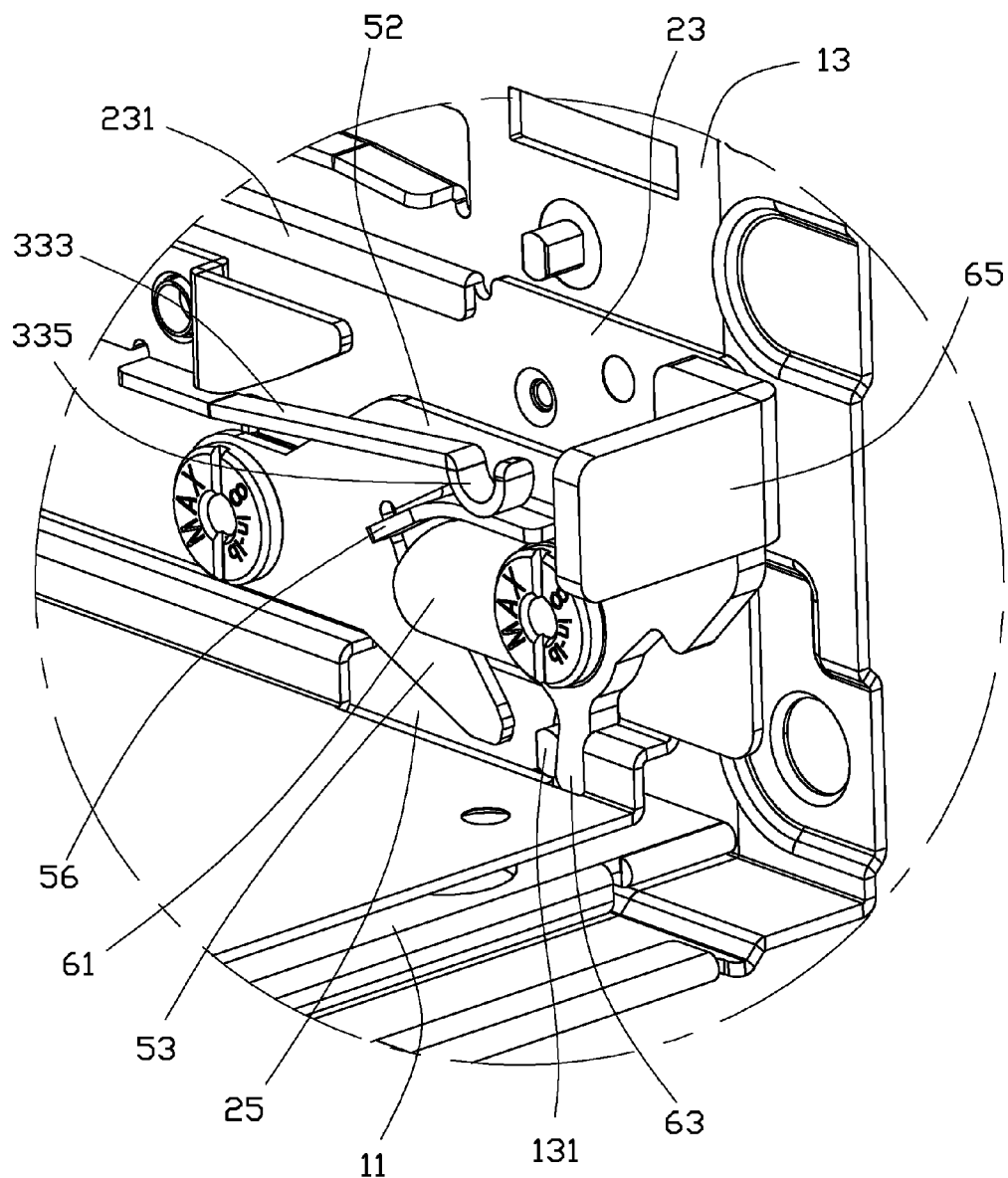
FIG. 6 is an enlarged view of a circled portion VI of FIG. 4.

FIGS. 4-6 show that, in assembly of the mounting assembly 300, the mounting portion 31 is secured to the sidewall 23 by riveting or a screw. The pivoting portion 51 is pivotably attached to the sidewall 23 by a shaft (not labeled). The protruding portion 335 is located on the blocking piece 56 and abuts the blocking piece 56. The first blocking portion 53 is inserted into the sliding slot 25. The installation portion 61 is rotatably attached to the sidewall 23, and a first end of the installation 61 is received in the receiving opening 55. A top edge of the installation portion 61 abuts the limiting piece 233, and the second blocking portion 63 is inserted into the sliding slot 25. The installation portion 61 is located between the limiting piece 233 and the second blocking portion 63. A gap is defined between the first blocking portion 53 and the second blocking portion 63.

In assembly of the bracket 20, the bracket 20 is moved between the limiting plate 133 and the bottom plate 11, and the limiting protrusion 131 is received in the connecting portion 22. The bracket 20 is slid into the chassis 10, and the limiting protrusion 131 is slid along the connecting portion 22, until the limiting protrusion 131 is slid into the sliding slot 25 and blocked by the first blocking portion 53. In this position, the first blocking portion 53 is located between the limiting protrusion 131 and the second blocking portion 63. The bracket 20 is further moved to bias the rotating member 50 to rotate away from the bottom wall 21 relative to the bracket 20 through the first blocking portion 53. The rotating member 50 is rotated away from the bottom wall 21 to elastically deform the resilient arm 333 upwards, until the limiting protrusion 131 is slid over the first blocking portion 53 and abuts the second blocking portion 63. The resilient arm 333 rebounds to bias the rotating member 50 to rotate towards the bottom wall 21. The limiting protrusion 131 is received between the first blocking portion 53 and the second blocking portion 63. Thus, the bracket 20 is mounted to the chassis 10 and prevented from being slid by the first blocking portion 53 and the second blocking portion 63. In this position, the mounting assembly 300 is located in a locked position.

In disassemble of the bracket 20, the operating portion 65 is rotated towards the bottom wall 21, to bias the second blocking portion 63 and the installation portion 61 rotates away from the bottom wall 21. The installation portion 61 biases the rotating member 50 to rotate away from the bottom wall 21, and the second blocking portion 63 biases the limiting protrusion 131 to slide along the sliding slot 25, until the limiting protrusion 131 slides over the first blocking portion 53 and disengages from blocking by the first blocking portion 53. Thus, the bracket 20 is slidable relative to the chassis and can be removed from the chassis 10. In this position, the mounting assembly 300 is located in an unlocked position.

The flange 231 is adapted for blocking the assisting portion 52 when the rotating member 50 is rotated away from the bottom wall 21, to prevent the rotating member 50 from over rotation and breaking the resilient arm 333. The limiting piece 233 is adapted for blocking the operating member 60 when the operating member 60 is rotated away from the bottom wall 21, to prevent the operating member 60 from over rotation when disengaging the installation 61 from the receiving opening 55.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. An electronic device enclosure comprising:
a chassis comprising a limiting protrusion and defining a sliding slot;
a bracket received in the chassis; and
a mounting assembly comprising:
a resisting member secured to the bracket and comprising an elastic deformable resisting portion;
a rotating member rotatably attached to the bracket and comprising a first blocking portion and a blocking piece; and
an operating member rotatably attached to the bracket and comprising an installation portion and a second blocking portion extending from the installation portion;
wherein the installation portion is received between the blocking piece and the first blocking portion; the blocking piece is located between the elastic deformable resisting portion and the installation portion; the first blocking portion and the second blocking portion are received in the sliding slot, and the limiting protrusion is blocked between the first blocking portion and the second blocking portion.

2. The electronic device enclosure of claim 1, wherein the bracket comprises a bottom wall, a sidewall, and a connecting portion connecting the bottom wall to the sidewall; the limiting protrusion is slidable along the sliding slot relative to the bracket; and the sliding slot is defined in the connecting portion.

3. The electronic device enclosure of claim 2, wherein the bracket further comprises a limiting piece extending from the sidewall, and the installation portion abuts the limiting portion between the limiting piece and the second blocking portion.

4. The electronic device enclosure of claim 3, wherein the limiting piece is oblique relative the bottom wall, and an acute angle is defined between the limiting piece and the bottom wall.

5. The electronic device enclosure of claim 2, wherein the operating member further comprises an operating portion connected to the installation portion, the operating portion is substantially perpendicular to the installation portion, and the operating portion is operable to bias the installation portion and the second blocking portion to rotate away from the bottom wall relative to the bracket.

6. The electronic device enclosure of claim 5, wherein the installation portion is rotatable away from the bottom wall to rotate the rotating member; the rotating member is rotatable to elastically deform the elastic deformable resisting portion; the second blocking portion is rotatable to slide the limiting protrusion in the sliding slot; and the limiting protrusion is slidable to disengage from between the first blocking portion and the second blocking portion.

7. The electronic device enclosure of claim 5, wherein the rotating member further comprises an assisting portion connected to the first blocking portion; a receiving opening is defined between the assisting portion and the first blocking portion, the installation portion is partially received in the receiving opening, and the blocking piece extends from a top edge of the receiving opening.

8. The electronic device enclosure of claim 7, wherein the bracket further comprises a flange extending from the sidewall, the flange blocks the assisting portion when the rotating member is rotated away from the bottom wall, to prevent the rotating member from over rotation and damaging the elastic deformable resisting portion.

9. The electronic device enclosure of claim 2, wherein the resisting member further comprises a mounting portion secured to the sidewall; the elastic deformable resisting portion comprises a connecting piece, a resilient arm, and a protruding portion; the connecting piece is connected to the mounting portion and a first end of the resilient arm, and the protruding portion is connected to a second end of the resilient arm and abuts the blocking piece; and the first end is opposite to the second end.

10. The electronic device enclosure of claim 9, wherein the blocking piece is curved, and the protruding portion is arched.

11. An electronic device enclosure comprising:
a chassis defining a sliding slot and comprising a bottom wall, a sidewall connected to the bottom wall, and a limiting protrusion protruding from the sidewall;
a bracket received in the chassis; and
a mounting assembly comprising:
a resisting member secured to the sidewall and comprising an elastic deformable resisting portion;
a rotating member rotatably attached to the sidewall and comprising a first blocking portion and a blocking piece; and
an operating member rotatably attached to the bracket and comprising an installation portion and a second blocking portion extending from the installation portion;
wherein the limiting protrusion is received in the sliding slot and located between the first blocking portion and the second blocking portion, the operating member is rotatable away from the bottom wall to bias the installation portion to rotate the rotating member through the blocking piece; the rotating member is rotatable away from the bottom wall to bias the blocking piece to elastically deform the elastic deformable resisting portion; and the first blocking portion is rotatable to bias the limiting protrusion to slide in the receiving slot and disengage from between the first blocking portion and the second blocking portion.

12. The electronic device enclosure of claim 11, wherein the installation portion is received between the blocking piece and the first blocking portion.

13. The electronic device enclosure of claim 11, wherein the blocking piece is located between the elastic deformable resisting portion and the installation portion, and the first blocking portion and the second blocking portion are received in the sliding slot.

14. The electronic device enclosure of claim 11, wherein the bracket further comprises a connecting portion, and the connecting portion connects the bottom wall to the sidewall; and the sliding slot is defined in the connecting portion.

15. The electronic device enclosure of claim 11, wherein the bracket further comprises a limiting piece extending from the sidewall, and the installation portion abuts the limiting portion between the limiting piece and the second blocking portion.

16. The electronic device enclosure of claim 15, wherein the limiting piece is oblique relative the bottom wall, and an acute angle is defined between the limiting piece and the bottom wall.

17. The electronic device enclosure of claim 11, wherein the operating member further comprises an operating portion connected to the installation portion, the operating portion is substantially perpendicular to the installation portion, and the operating portion is operable to bias the installation portion and the second blocking portion to rotate away from the bottom wall relative to the bracket.

18. The electronic device enclosure of claim 11, wherein the rotating member further comprises an assisting portion connected to the first blocking portion; a receiving opening is defined between the assisting portion and the first blocking portion, the installation portion is partially received in the receiving opening, and the blocking piece extends from a top edge of the receiving opening.

19. The electronic device enclosure of claim 18, wherein the bracket further comprises a flange extending from the sidewall, the flange blocks the assisting portion when the rotating member is rotated away from the bottom wall, to prevent the rotating member from over rotation to damage the elastic deformable resisting portion.

20. The electronic device enclosure of claim 11, wherein the resisting member further comprises a mounting portion secured to the sidewall; the elastic deformable resisting portion comprises a connecting piece, a resilient arm, and a protruding portion; the connecting piece is connected to the mounting portion and a first end of the resilient arm, and the protruding portion is connected to a second end of the resilient arm and abuts the blocking piece; and the first end is opposite to the second end.

* * * * *